(12) United States Patent
Kido et al.

(10) Patent No.: US 12,537,511 B2
(45) Date of Patent: Jan. 27, 2026

(54) RADIO-FREQUENCY MODULE AND COMMUNICATION DEVICE

(71) Applicant: Murata Manufacturing Co., Ltd., Nagaokakyo (JP)

(72) Inventors: Syunsuke Kido, Nagaokakyo (JP); Takanori Uejima, Nagaokakyo (JP); Naru Morito, Nagaokakyo (JP); Masanari Miura, Nagaokakyo (JP); Yukiya Yamaguchi, Nagaokakyo (JP); Takuma Kuroyanagi, Nagaokakyo (JP); Tomomi Yasuda, Nagaokakyo (JP); Masanori Kato, Nagaokakyo (JP); Yuuki Fukuda, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 355 days.

(21) Appl. No.: 18/472,237

(22) Filed: Sep. 22, 2023

(65) Prior Publication Data

US 2024/0014804 A1 Jan. 11, 2024

Related U.S. Application Data

(63) Continuation of application No. PCT/JP2022/010316, filed on Mar. 9, 2022.

(30) Foreign Application Priority Data

Mar. 26, 2021 (JP) ................. 2021-052524

(51) Int. Cl.
*H03H 9/54* (2006.01)
*H03F 3/24* (2006.01)
(52) U.S. Cl.
CPC ............. *H03H 9/542* (2013.01); *H03F 3/245* (2013.01); *H03F 2200/294* (2013.01); *H03F 2200/451* (2013.01)

(58) Field of Classification Search
CPC .... H03H 9/542; H03H 7/1766; H03H 9/0542; H03H 9/0552; H03H 9/0557;
(Continued)

(56) References Cited

U.S. PATENT DOCUMENTS

2018/0102578 A1* 4/2018 Huang ................. H01P 11/007
2021/0091751 A1* 3/2021 Komatsu ................. H03H 9/72
(Continued)

FOREIGN PATENT DOCUMENTS

JP H11-220312 A 8/1999
JP 2002-290257 A 10/2002
(Continued)

OTHER PUBLICATIONS

International Search Report and Written Opinion mailed on Jun. 14, 2022, received for PCT Application PCT/JP2022/010316, filed on Mar. 9, 2022, 8 pages including English Translation.

*Primary Examiner* — Ping Y Hsieh
(74) *Attorney, Agent, or Firm* — XSENSUS LLP

(57) ABSTRACT

A radio-frequency module includes a module substrate having main surfaces opposite to each other, a hybrid filter having a first acoustic wave resonator, a first inductor, and a first capacitor, a switch for connecting and disconnecting an antenna connection terminal and the hybrid filter, and a coupler disposed on a path linking the antenna connection terminal and the switch. The first acoustic wave resonator is disposed on the main surface, the switch is included in a semiconductor IC disposed on the main surface, the coupler is disposed inside the module substrate, and in plan view of the module substrate, the semiconductor IC at least partially overlaps the first acoustic wave resonator, and the semiconductor IC and the coupler at least partially overlaps.

20 Claims, 7 Drawing Sheets

(58) Field of Classification Search
CPC ...... H03H 9/605; H03H 9/6483; H03F 3/245; H03F 2200/294; H03F 2200/451; H03F 2200/165; H03F 2200/171; H03F 3/195; H01L 23/12; H01L 25/00; H04B 1/00; H04B 1/38
See application file for complete search history.

(56) References Cited

U.S. PATENT DOCUMENTS

| | | | |
|---|---|---|---|
| 2022/0239257 A1* | 7/2022 | Hansen | H03F 3/45475 |
| 2022/0302899 A1* | 9/2022 | Mori | H03H 9/725 |
| 2024/0014804 A1* | 1/2024 | Kido | H01L 25/00 |

FOREIGN PATENT DOCUMENTS

| | | | |
|---|---|---|---|
| JP | 2002-300081 A | 10/2002 |
| JP | 2005-295503 A | 10/2005 |
| JP | 2009-038807 A | 2/2009 |
| JP | 2020-014204 A | 1/2020 |

* cited by examiner

RADIO-FREQUENCY MODULE AND COMMUNICATION DEVICE

CROSS-REFERENCE TO RELATED APPLICATIONS

This application is a continuation of international application no. PCT/JP2022/010316, filed Mar. 9, 2022, which claims priority to Japanese application no. JP 2021-052524, filed Mar. 26, 2021. The entire contents of both prior applications are hereby incorporated by reference.

TECHNICAL FIELD

The present disclosure relates to a radio-frequency module and a communication device.

BACKGROUND ART

A hybrid acoustic LC filter includes an acoustic resonator (acoustic wave resonator), an inductor, and a capacitor. With this, it is possible to achieve a relatively wide pass band and to satisfy strict out-of-band rejection specifications.

CITATION LIST

Patent Document

Patent Document 1: Japanese Unexamined Patent Application Publication No. 2020-14204

SUMMARY OF INVENTION

Technical Problem

In a front-end radio-frequency module in which the hybrid acoustic LC filter is disposed, a coupler for measuring signal strength is disposed on a signal path between an antenna connection terminal and the hybrid acoustic LC filter.

However, in the radio-frequency module having the hybrid acoustic LC filter and the coupler, the number of components of the hybrid acoustic LC filter is large, and thus a disposition area including the coupler and the hybrid acoustic LC filter tends to be large. For this reason, there is a concern that a wiring line of the above signal path is lengthened and a transmission loss of the radio-frequency module increases.

Accordingly, the present disclosure solves at least the above-described problems, and thus a radio-frequency module and a communication device with a reduced transmission loss despite having a hybrid filter and a coupler are provided.

Solution to Problem

A radio-frequency module according to an aspect of the present disclosure includes a substrate having a first main surface that is opposite to a second main surface, an antenna connection terminal, a first hybrid filter having a first acoustic wave resonator, a first inductor, and a first capacitor, a first switch connected between the antenna connection terminal and the first hybrid filter and configured to connect and disconnect the antenna connection terminal and the first hybrid filter, and a coupler disposed on a path linking the antenna connection terminal and the first switch. The first acoustic wave resonator is disposed on the first main surface, the first switch is included in a semiconductor integrated circuit (IC) disposed on the second main surface, the coupler is disposed inside the substrate, and in a plan view of the substrate, the semiconductor IC at least partially overlaps the first acoustic wave resonator, and the semiconductor IC at least partially overlaps the coupler.

Additionally, a radio-frequency module according to an aspect of the present disclosure includes a substrate having a first main surface that is opposite to a second main surface, an antenna connection terminal, a first hybrid filter having a first acoustic wave resonator, a first inductor, and a first capacitor, a first switch connected between the antenna connection terminal and the first hybrid filter and configured to connect and disconnect between the antenna connection terminal and the first hybrid filter, and a coupler disposed on a path linking the first switch and the first hybrid filter. The first acoustic wave resonator is disposed on the first main surface, the first switch is included in a semiconductor IC disposed on the second main surface, the coupler is disposed inside the substrate, and in a plan view of the substrate, the coupler at least partially overlaps the first acoustic wave resonator, and the coupler at least partially overlaps the semiconductor IC.

Exemplary Advantageous Effects

According to the present disclosure, it is possible to provide a radio-frequency module and a communication device with a reduced transmission loss despite having a hybrid filter and a coupler.

DETAILED DESCRIPTION

Figure 1:
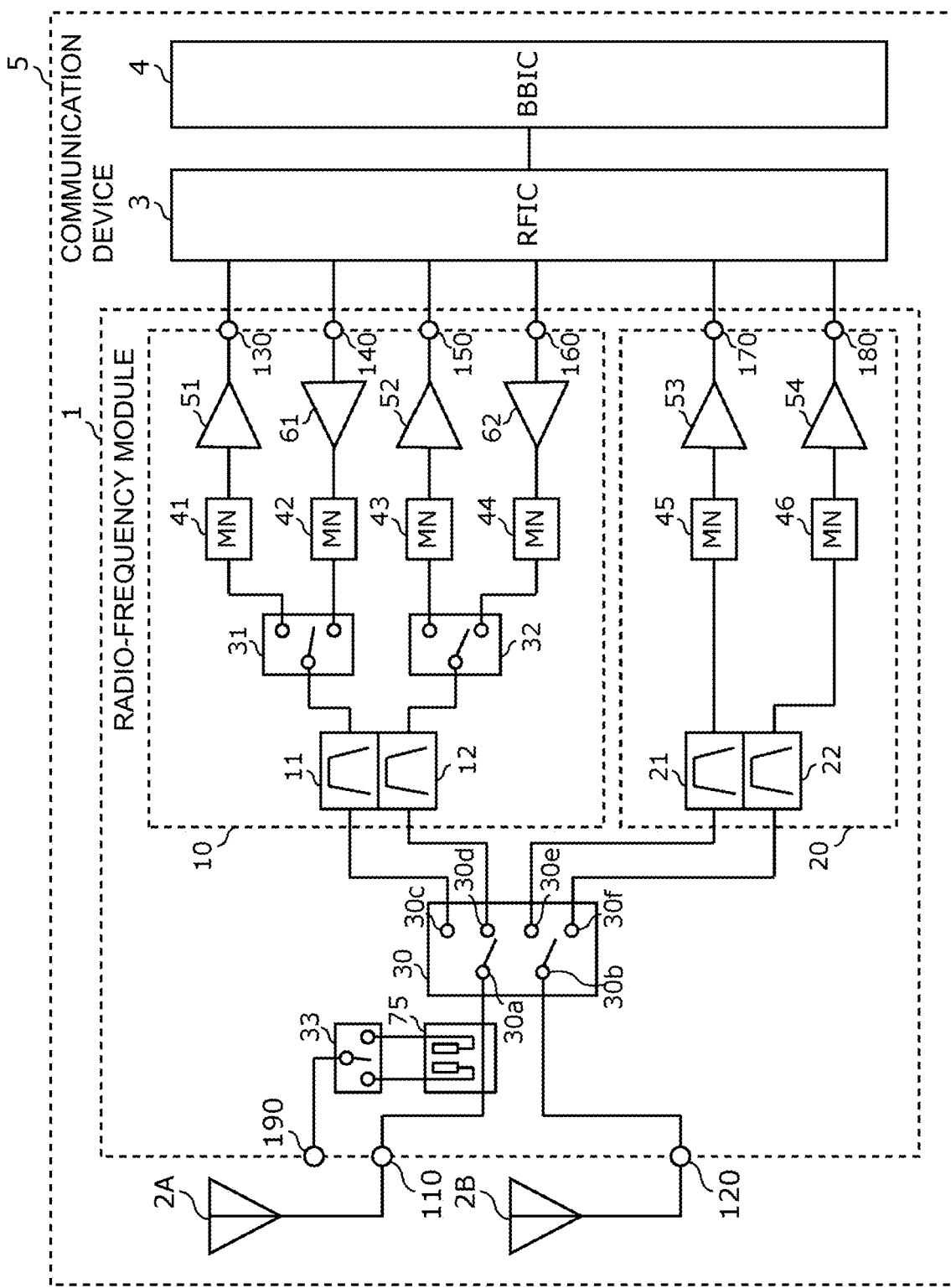
FIG. 1 is a circuit configuration diagram of a radio-frequency module and a communication device according to an exemplary embodiment.

Hereinafter, an exemplary embodiment of the present disclosure will be described in detail. Note that the exemplary embodiment described below illustrates a comprehensive or specific example. Numerical values, shapes, materials, constituent elements, disposition of constituent elements, connection modes, and the like illustrated in the following exemplary embodiment are mere examples and are not intended to be limiting upon the present disclosure. Among constituent elements in the following examples and modifications, constituent elements not recited in the independent claims are described as optional constituent elements. In addition, sizes or size ratios of constituent elements illustrated in the drawings are not necessarily precise. In each drawing, substantially the same configurations are denoted by the same reference numerals, and redundant description may be omitted or simplified.

In addition, in the following description, a term indicating a relationship between elements such as parallel or perpendicular, a term indicating a shape of an element such as a rectangular shape, and a numerical range represents not only a strict meaning but also a meaning including a substantially equivalent range, for example, a difference of about several %.

Further, in the following description, "A is disposed on a first main surface of a substrate" means not only that A is directly mounted on the first main surface but also that A is disposed in, of a space on the first main surface side and a space on a second main surface side separated by the substrate, a space on the first main surface side. That is, a case is included in which A is mounted on the first main surface with another circuit element, an electrode, or the like interposed therebetween.

In addition, in the following description, "connected" includes not only a case of being directly connected by using a connection terminal and/or a wiring conductor but also a case of being electrically connected via another circuit component. In addition, "connected between A and B" means being connected to both A and B between A and B.

In each of the following drawings, an x-axis and a y-axis are axes orthogonal to each other on a plane parallel to a main surface of a module substrate. In addition, a z-axis is an axis perpendicular to the main surface of the module substrate, and a positive direction thereof indicates an upward direction and a negative direction thereof indicates a downward direction.

In addition, in a module configuration of the present disclosure, "in plan view" means that an object is viewed from a positive side of the z-axis by orthographic projection onto an xy plane. "A component is disposed on the main surface of the substrate" includes not only a case where the component is disposed on the main surface in a state of being in contact with the main surface of the substrate but also a case where the component is disposed above the main surface without being in contact with the main surface and a case where a part of the component is disposed so as to be embedded in the substrate from a side of the main surface.

In addition, in the following description, for A, B and C mounted on the substrate, "C is disposed between A and B in plan view of the substrate (or the main surface of the substrate)" means that at least one line segment among a plurality of line segments linking an arbitrary point in A and an arbitrary point in B in plan view of the substrate passes through a region of C. Further, "in plan view of the substrate" means that the substrate and a circuit element mounted on the substrate are viewed by orthographic projection onto a plane parallel to the main surface of the substrate.

In addition, in the following description, a "transmission path" means a transmission line configured with a wiring line through which a radio-frequency transmission signal propagates, an electrode directly connected to the wiring line, a terminal directly connected to the wiring line or the electrode, and the like. In addition, a "reception path" means a transmission line configured with a wiring line through which a radio-frequency reception signal propagates, an electrode directly connected to the wiring line, a terminal directly connected to the wiring line or the electrode, and the like.

Exemplary Embodiment

[1. Configuration of Radio-Frequency Module 1 and Communication Device 5 According to an Exemplary Embodiment]

FIG. 1 is a circuit configuration diagram of a radio-frequency module 1 and a communication device 5 according to an exemplary embodiment. As illustrated in FIG. 1, the communication device 5 includes the radio-frequency module 1, antennas 2A and 2B, an RF signal processing circuit (RFIC) 3 and a baseband signal processing circuit (BBIC) 4.

The RFIC 3 is an RF signal processing circuit that processes radio-frequency signals transmitted and received by the antennas 2A and 2B. To be specific, the RFIC 3 applies signal processing on a reception signal inputted via a reception path of the radio-frequency module 1 by down-conversion or the like, and outputs the reception signal generated by the signal processing to the BBIC 4. Further, the RFIC 3 outputs a radio-frequency transmission signal processed based on a signal inputted from the BBIC 4 to a transmission path of the radio-frequency module 1.

The BBIC 4 is a circuit that processes data using a signal having a frequency lower than that of a radio-frequency signal transmitted through the radio-frequency module 1. The signal processed by the BBIC 4 is used, for example, as an image signal for image display or used as an audio signal for a call via a speaker.

In addition, the RFIC 3 has a function as a control unit that controls connection of switches 30, 31, 32 and 33 included in the radio-frequency module 1 based on whether the radio-frequency module 1 is used for transmission or reception, and a communication band (frequency band) to be used. To be specific, the RFIC 3 switches the connection of the switches 30, 31, 32 and 33 included in the radio-frequency module 1 by a control signal (not illustrated). Note that the control unit may be provided outside the RFIC 3, for example, or may be provided in the radio-frequency module 1 or the BBIC 4.

Further, the RFIC 3 also has a function as a control unit that controls gains of power amplifiers 61 and 62 included in the radio-frequency module 1, and a power supply voltage Vcc and a bias voltage Vbias supplied to the power amplifiers 61 and 62.

The antenna 2A is connected to an antenna connection terminal 110 of the radio-frequency module 1 and radiates a radio-frequency signal outputted from the radio-frequency module 1 or receives a radio-frequency signal from outside and outputs the radio-frequency signal to the radio-frequency module 1. The antenna 2B is connected to an antenna connection terminal 120 of the radio-frequency module 1 and radiates a radio-frequency signal outputted from the radio-frequency module 1 or receives a radio-frequency signal from outside and outputs the radio-frequency signal to the radio-frequency module 1.

Note that in the communication device 5 according to the exemplary embodiment, the antennas 2A, 2B and the BBIC 4 are not essential constituent elements.

Next, a detailed configuration of the radio-frequency module 1 will be described.

As illustrated in FIG. 1, the radio-frequency module 1 includes the antenna connection terminals 110 and 120, a coupler terminal 190, a coupler 75, the switches 30 and 33, and radio-frequency circuits 10 and 20.

The antenna connection terminal 110 is a first antenna common terminal connected to the antenna 2A, and the antenna connection terminal 120 is a second antenna common terminal connected to the antenna 2B.

The switch 33 has a common terminal and two selection terminals. The common terminal of the switch 33 is connected to the coupler terminal 190. One selection terminal of the switch 33 is connected to one sub-line included in the coupler 75, and another selection terminal of the switch 33 is connected to another sub-line included in the coupler 75. That is, the switch 33 switches between connection between the coupler terminal 190 and the one sub-line and connection between the coupler terminal 190 and the other sub-line. The switch 33 is configured with, for example, a single pole double throw (SPDT) type switch circuit.

The coupler 75 is disposed on a signal path (main line) linking the switch 30 and the antenna connection terminal 110, detects a radio-frequency signal transmitted through the main line, and measures signal strength of the radio-frequency signal. The coupler 75 is configured with, for example, a sub-line which is disposed in proximity to and in parallel to the main line, and a termination circuit. One end of the sub-line is connected to the termination circuit, and another end is connected to the one selection terminal of the switch 33. Note that the coupler 75 may have a plurality of the sub-lines. In a case where the coupler 75 has the plurality of sub-lines, for example, by selecting from the sub-lines connected to the coupler terminal 190 by switching of the switch 33, it is possible to select from detection of a radio-frequency signal flowing from the antenna connection terminal 110 to the switch 30 and detection of a radio-frequency signal flowing from the switch 30 to the antenna connection terminal 110. Alternatively, by selecting from the sub-lines connected to the coupler terminal 190 by switching of the switch 33, it is possible to select from detection of a radio-frequency signal in a first communication band and detection of a radio-frequency signal in a second communication band.

The switch 30 is an example of a first switch and includes common terminals 30a and 30b and selection terminals 30c, 30d, 30e and 30f, and switches between connection and disconnection between the common terminal 30a and at least one of the selection terminals 30c to 30f, and switches between connection and disconnection between the common terminal 30b and at least one of the selection terminals 30c to 30f. The common terminal 30a is connected to the antenna connection terminal 110. The common terminals 30b is connected to the antenna connection terminal 120. The selection terminal 30c is connected to a hybrid filter 11. The selection terminal 30d is connected to a filter 12. The selection terminal 30e is connected to a hybrid filter 21. The selection terminal 30f is connected to a filter 22. The switch 30 switches between connection and disconnection between the hybrid filter 11 and the antenna connection terminal 110, and switches between connection and disconnection between the hybrid filter 11 and the antenna connection terminal 120. Further, the switch 30 switches between connection and disconnection between the filter 12 and the antenna connection terminal 110, and switches between connection and disconnection between the filter 12 and the antenna connection terminal 120. Further, the switch 30 switches between connection and disconnection between the hybrid filter 21 and the antenna connection terminal 110, and switches between connection and disconnection between the hybrid filter 21 and the antenna connection terminal 120. Further, the switch 30 switches between connection and disconnection between the filter 22 and the antenna connection terminal 110, and switches between connection and disconnection between the filter 22 and the antenna connection terminal 120.

According to the above-described connection configuration of the switch 30, in the communication device 5, the antenna 2A can be connected to at least one of the hybrid filters 11 and 21 and the filters 12 and 22, and the antenna 2B can be connected to at least one of the hybrid filters 11 and 21 and the filters 12 and 22.

The radio-frequency circuit 10 includes reception output terminals 130 and 150, transmission input terminals 140 and 160, the hybrid filter 11, the filter 12, the switches 31 and 32, matching circuits 41, 42, 43 and 44, low-noise amplifiers 51 and 52, and the power amplifiers 61 and 62.

The hybrid filter 11 is an example of a first hybrid filter and is a filter including one or more first acoustic wave resonators, one or more first inductors, and one or more first capacitors. One terminal of the hybrid filter 11 is connected to the selection terminal 30c, and another terminal is connected to the switch 31.

The filter 12 is a filter including one or more third acoustic wave resonators and one or more third inductors. One terminal of the filter 12 is connected to the selection terminal 30d, and another terminal is connected to the switch 32.

Note that each of the first acoustic wave resonator and a third acoustic wave element is, for example, an acoustic wave resonator in which a surface acoustic wave (SAW) is used or an acoustic wave resonator in which a bulk acoustic wave (BAW) is used.

Figure 2A:
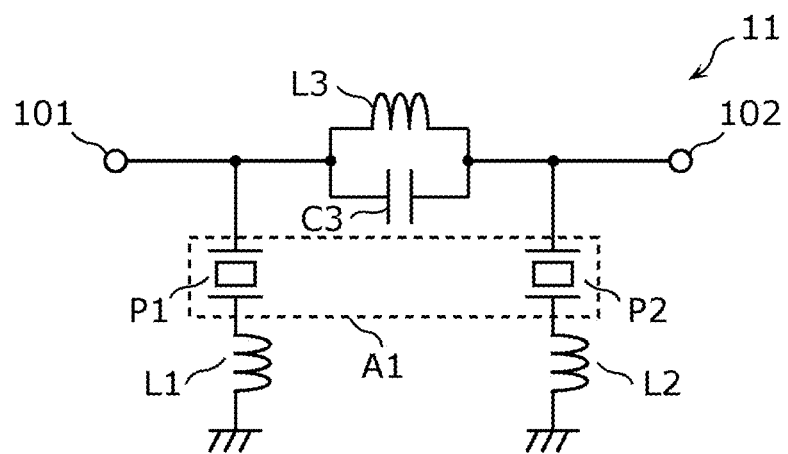
FIG. 2A is a diagram illustrating an example of a circuit configuration of a first hybrid filter according to the exemplary embodiment.

FIG. 2A is a diagram illustrating an example of a circuit configuration of the hybrid filter 11 according to the exemplary embodiment. As illustrated in FIG. 2A, the hybrid filter 11 includes acoustic wave resonators P1 and P2, a capacitor C3, and inductors L1, L2, and L3. Each of the acoustic wave resonators P1 and P2 is an example of the first acoustic wave resonator, each of the inductors L1, L2, and L3 is an example of the first inductor, and the capacitor C3 is an example of the first capacitor.

The inductor L3 and the capacitor C3 constitute an LC parallel resonant circuit. A series connection circuit of the acoustic wave resonator P1 and the inductor L1 is disposed between a node on a path linking an input/output terminal 101 and the above LC parallel resonant circuit, and a ground. A series connection circuit of the acoustic wave resonator P2 and the inductor L2 is disposed between a node on a path linking an input/output terminal 102 and the above LC parallel resonant circuit, and the ground. The acoustic wave resonators P1 and P2 form an acoustic wave resonator A1, and are formed as one chip, for example. Note that "a plurality of acoustic wave resonators is formed as one chip" is defined as "the plurality of acoustic wave resonators is formed on one piezoelectric substrate" or "the plurality of acoustic wave resonators is included in one package".

In the above-described configuration, a pass band and an attenuation band of the hybrid filter 11 are formed by adjusting a resonant frequency of the LC parallel resonant circuit including the inductor L3 and the capacitor C3, and a resonant frequency and an anti-resonant frequency of each of the acoustic wave resonators P1 and P2. The pass band of the hybrid filter 11 is formed by the LC parallel resonant circuit including the inductor L3 and the capacitor C3, and an attenuation pole is formed by the acoustic wave resonators P1 and P2.

That is, in the hybrid filter 11, a wide pass band that cannot be achieved by the acoustic wave resonator can be ensured by the LC circuit, and a steep attenuation slope that cannot be achieved by the LC circuit can be ensured by the acoustic wave resonator.

From this point of view, a pass band width of the hybrid filter 11 is greater than a resonant band width of each of the acoustic wave resonators P1 and P2.

Note that in the exemplary embodiment, a resonant band width of an acoustic wave resonator is defined as a difference between an anti-resonant frequency and a resonant frequency of the acoustic wave resonator. Further, a resonant band width ratio is defined as a ratio obtained by dividing the above resonant band width by an intermediate value between the anti-resonant frequency and the resonant frequency. It is known that general SAW resonators and BAW resonators each have a resonant band width ratio from 3 to 4% in a frequency band from 0.1 to 10 GHz.

Note that the filter 12 need not include a capacitor, and a pass band width of the filter 12 may be equal to or less than a resonant band width of the third acoustic wave resonator.

Referring back to FIG. 1, circuit components of the radio-frequency circuit 10 will be described.

The low-noise amplifier 51 is an example of a first low-noise amplifier, and is an amplifier that amplifies a reception signal in the first communication band with low noise, and outputs the amplified reception signal to the reception output terminal 130. The low-noise amplifier 52 is an amplifier that amplifies a reception signal in the second communication band with low noise, and outputs the amplified reception signal to the reception output terminal 150.

The power amplifier 61 is an example of a first power amplifier and is an amplifier that amplifies a transmission signal in the first communication band inputted from the transmission input terminal 140. The power amplifier 62 is an amplifier that amplifies a transmission signal in the second communication band inputted from the transmission input terminal 160.

The matching circuit 41 is connected between the low-noise amplifier 51 and the switch 31, and achieves impedance matching between the low-noise amplifier 51 and the switch 31. The matching circuit 42 is connected between the power amplifier 61 and the switch 31, and achieves impedance matching between the power amplifier 61 and the switch 31. The matching circuit 43 is connected between the low-noise amplifier 52 and the switch 32, and achieves impedance matching between the low-noise amplifier 52 and the switch 32. The matching circuit 44 is connected between the power amplifier 62 and the switch 32, and achieves impedance matching between the power amplifier 62 and the switch 32.

The switch 31 is an example of a second switch, and has a common terminal and two selection terminals. The common terminal of the switch 31 is connected to the hybrid filter 11. One selection terminal of the switch 31 is connected to an input terminal of the low-noise amplifier 51 via the matching circuit 41, and another selection terminal of the switch 31 is connected to an output terminal of the power amplifier 61 via the matching circuit 42. That is, the switch 31 is a time division duplex (TDD) switch that is connected to the hybrid filter 11, the low-noise amplifier 51, and the power amplifier 61 and switches between connection between the hybrid filter 11 and the low-noise amplifier 51 and connection between the hybrid filter 11 and the power amplifier 61. The switch 31 is constituted with, for example, an SPDT-type switch circuit.

By the switch 31, the hybrid filter 11 functions as a transmission-and-reception filter connected to the low-noise amplifier 51 and the power amplifier 61.

The switch 32 has a common terminal and two selection terminals. The common terminal of the switch 32 is connected to the filter 12. One selection terminal of the switch 32 is connected to the low-noise amplifier 52 via the matching circuit 43, and another selection terminal of the switch 32 is connected to the power amplifier 62 via the matching circuit 44. That is, the switch 32 is a TDD switch that switches between connection between the filter 12 and the low-noise amplifier 52 and connection between the filter 12 and the power amplifier 62. The switch 32 is constituted with, for example, an SPDT-type switch circuit.

By the switch 32, the filter 12 functions as a transmission-and-reception filter connected to the low-noise amplifier 52 and the power amplifier 62.

The radio-frequency circuit 20 includes reception output terminals 170 and 180, the hybrid filter 21, the filter 22, matching circuits 45 and 46, and low-noise amplifiers 53 and 54.

The hybrid filter 21 is an example of a second hybrid filter, and is a filter including one or more second acoustic wave resonators, one or more second inductors, and one or more second capacitors. One terminal of the hybrid filter 21 is connected to the selection terminal 30e, and another terminal is connected to the low-noise amplifier 53 via the matching circuit 45. Note that the hybrid filter 21 is not connected to a power amplifier.

According to the above, the hybrid filter 21 functions as a reception-only filter connected between the switch 30 and the low-noise amplifier 53.

The filter 22 is a filter including one or more fourth acoustic wave resonators and one or more fourth inductors. One terminal of the filter 22 is connected to the selection terminal 30f, and another terminal is connected to the low-noise amplifier 54 via the matching circuit 46. Note that the filter 22 is not connected to a power amplifier.

According to the above, the filter 22 functions as a reception-only filter connected to the switch 30.

Note that each of the second acoustic wave resonator and a fourth acoustic wave element is, for example, an acoustic wave resonator in which an SAW is used or an acoustic wave resonator in which a BAW is used.

Figure 2B:
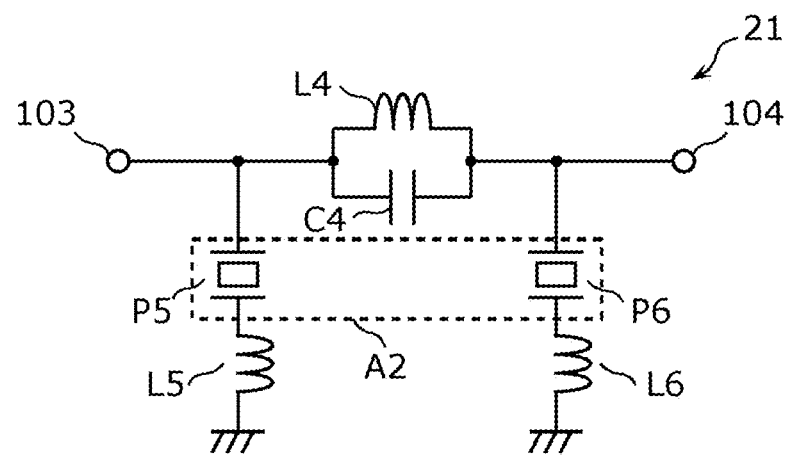
FIG. 2B is a diagram illustrating an example of a circuit configuration of a second hybrid filter according to the exemplary embodiment.

FIG. 2B is a diagram illustrating an example of a circuit configuration of the hybrid filter 21 according to the exemplary embodiment. As illustrated in FIG. 2B, the hybrid filter 21 includes acoustic wave resonators P5 and P6, a capacitor C4, and inductors L4, L5, and L6. Each of the acoustic wave resonators P5 and P6 is an example of the second acoustic wave resonator, each of the inductors L4, L5, and L6 is an example of the second inductor, and the capacitor C4 is an example of the second capacitor.

The inductor L4 and the capacitor C4 constitutes an LC parallel resonant circuit. A series connection circuit of the acoustic wave resonator P5 and the inductor L5 is disposed between a node on a path linking an input/output terminal 103 and the above LC parallel resonant circuit, and the ground. A series connection circuit of the acoustic wave resonator P6 and the inductor L6 is disposed between a node on a path linking an input/output terminal 104 and the above LC parallel resonant circuit, and the ground. The acoustic wave resonators P5 and P6 form an acoustic wave resonator A2, and are formed as one chip, for example.

In the above-described configuration, a pass band and an attenuation band of the hybrid filter 21 are formed by adjusting a resonant frequency of the LC parallel resonant circuit including the inductor L4 and the capacitor C4, and a resonant frequency and an anti-resonant frequency of each of the acoustic wave resonators P5 and P6. The pass band of the hybrid filter 21 is formed by the LC parallel resonant circuit including the inductor L4 and the capacitor C4, and an attenuation pole is formed by the acoustic wave resonators P5 and P6.

That is, in the hybrid filter 21, a wide pass band that cannot be achieved by the acoustic wave resonator can be ensured by the LC circuit, and a steep attenuation slope that cannot be achieved by the LC circuit can be ensured by the acoustic wave resonator.

From this point of view, a pass band width of the hybrid filter 21 is greater than a resonant band width of each of the acoustic wave resonators P5 and P6.

Note that the filter 22 need not include a capacitor, and a pass band width of the filter 22 may be equal to or less than a resonant band width of the fourth acoustic wave resonator.

Referring back to FIG. 1, circuit components of the radio-frequency circuit 20 will be described.

The low-noise amplifier 53 is an example of a second low-noise amplifier, and is an amplifier that amplifies a reception signal in the first communication band with low noise, and outputs the amplified reception signal to the reception output terminal 170. The low-noise amplifier 54 amplifies a reception signal in the second communication band with low noise, and outputs the amplified reception signal to the reception output terminal 180.

The matching circuit 45 is connected between the low-noise amplifier 53 and the hybrid filter 21, and achieves impedance matching between the low-noise amplifier 53 and the hybrid filter 21. The matching circuit 46 is connected between the low-noise amplifier 54 and the filter 22, and achieves impedance matching between the low-noise amplifier 54 and the filter 22.

According to the above-described circuit configuration, the radio-frequency module 1 can independently transmit a transmission signal in the first communication band, a reception signal in the first communication band, a transmission signal in the second communication band, and a reception signal in the second communication band, or can simultaneously transmit at least two of the signals.

The pass band of each of the hybrid filters 11 and 21 includes, for example, n77 (3300 to 4200 MHz) of 5th generation new radio (5G-NR), and the pass band of each of the filters 12 and 22 includes, for example, n79 (4400 to 5000 MHz) of 5G-NR.

Note that the pass band of any one of the hybrid filters 11 and 21 and the filters 12 and 22 may include at least one of Band 42 (3400 to 3600 MHz), Band 43 (3600 to 3800 MHz), Band 48 (3550 to 3700 MHz), and Band 49 (3550 to 3700 MHz) of 4th Generation Long Term Evolution (4G-LTE), n77 (3300 to 4200 MHz), n78 (3300 to 3800 MHz), n79 (4400 to 5000 MHz), n46 (5150 to 5925 MHz), n96 (5925 to 7125 MHz), and n97 of 5G-NR, WLAN (5150-5350 MHz), WLAN (5470 to 5850 MHz), and WLAN (5925 to 7125 MHz).

Note that the switch 30 is formed in a semiconductor IC. Additionally, at least one of the low-noise amplifiers 51, 52, 53 and 54, and the switches 31 and 32 may be formed in a single semiconductor IC together with the switch 30. The semiconductor IC is constituted with, for example, a CMOS. Specifically, the semiconductor IC is formed by an SOI process. Thus, the semiconductor IC can be manufactured at low cost. Note that the semiconductor IC may be made of at least one of GaAs, SiGe and GaN. Thus, it is possible to output a radio-frequency signal having high-quality amplification performance and noise performance.

Note that the circuit configurations of the hybrid filters 11 and 21 according to the exemplary embodiment are not limited to the circuit configurations illustrated in FIG. 2A and FIG. 2B. It is sufficient that each of the hybrid filters 11 and 21 according to the exemplary embodiment includes one or more acoustic wave resonators, one or more inductors, and one or more capacitors, and a pass band width of the hybrid filter is greater than a resonant band width of the acoustic wave resonator. In addition, in the circuit configuration of each of the hybrid filters 11 and 21 according to the exemplary embodiment, no switch is disposed between the acoustic wave resonator and the LC circuit. For example, in the hybrid filter 11, no switch is inserted between the LC parallel resonant circuit, including the inductor L3 and the capacitor C3, and the acoustic wave resonator P1 or between the LC parallel resonant circuit and the acoustic wave resonator P2.

Further, the one terminal of the hybrid filter 11 and the one terminal of the filter 12 may be connected to the same selection terminal of the switch 30. Further, the one terminal of the hybrid filter 21 and the one terminal of the filter 22 may be connected to the same selection terminal of the switch 30.

Further, a filter may be connected each of between the switch 31 and the low-noise amplifier 51, between the switch 31 and the power amplifier 61, between the switch 32 and the low-noise amplifier 52, and between the switch 32 and the power amplifier 62.

Note that the radio-frequency module 1 according to the exemplary embodiment only needs to include at least the antenna connection terminal 110, the hybrid filter 11, the switch 30 and the coupler 75 among the circuit components and the circuit elements illustrated in FIG. 1.

[2. Configuration of Radio-Frequency Module 6 According to Modification of the Exemplary Embodiment]

Next, a configuration of a radio-frequency module 6 according to a modification of the exemplary embodiment will be described.

Figure 3:
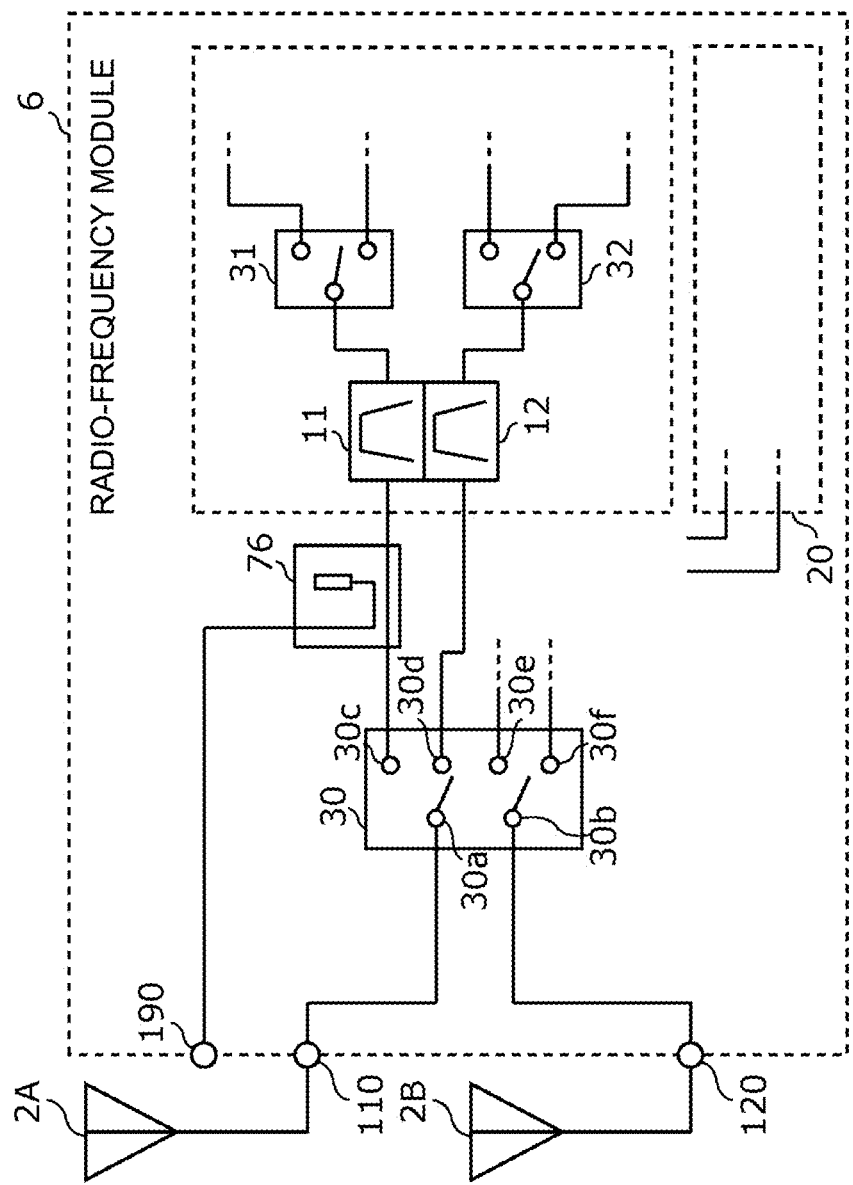
FIG. 3 is a circuit configuration diagram of a radio-frequency module according to a modification of the exemplary embodiment.

FIG. 3 is a circuit configuration diagram of the radio-frequency module 6 according to the modification of the exemplary embodiment. As illustrated in FIG. 3, the radio-frequency module 6 includes the antenna connection terminals 110 and 120, the coupler terminal 190, a coupler 76, the switch 30, and the radio-frequency circuits 10 and 20.

The radio-frequency module 6 according to the present modification is different from the radio-frequency module 1 according to the exemplary embodiment in a configuration and a disposition position of the coupler 76. Hereinafter, with respect to the radio-frequency module 6 according to the present modification, a description of the same configuration as that of the radio-frequency module 1 according to the exemplary embodiment will be omitted, and a description will be given focusing on a different configuration.

The coupler 76 is disposed on a signal path (main line) linking the switch 30 and the hybrid filter 11 of the radio-frequency circuit 10, detects a radio-frequency signal transmitted through the main line, and measures signal strength of the radio-frequency signal. The coupler 76 is constituted with, for example, a sub-line which is disposed in proximity to and in parallel to the main line and a termination circuit. One end of the sub-line is connected to the termination circuit, and another end is connected to the coupler terminal 190. Note that the coupler 76 may include a plurality of the sub-lines. In a case where the coupler 76 has the plurality of sub-lines, for example, by selecting from the sub-lines connected to the coupler terminal 190 by switching of a switch connected to the coupler 76, it is possible to select from detection of a radio-frequency signal flowing from the switch 30 to the hybrid filter 11 and detection of a radio-frequency signal flowing from the hybrid filter 11 to the switch 30.

Here, in the radio-frequency modules 1 and 6, since the number of components of the hybrid filter 11 is large, a disposition area including the coupler and the hybrid filter tends to be large. Thus, there is a concern that a wiring line of a signal path linking the antenna connection terminal 110 and the hybrid filter 11 is lengthened and a transmission loss of each of the radio-frequency modules 1 and 6 increases.

On the other hand, a configuration of each of the radio-frequency modules 1 and 6 with a reduced transmission loss despite having a hybrid filter and a coupler will be described below.

[3. Disposition Configuration of Circuit Elements of Radio-Frequency Module 1A According to Example 1]

Figure 4A:
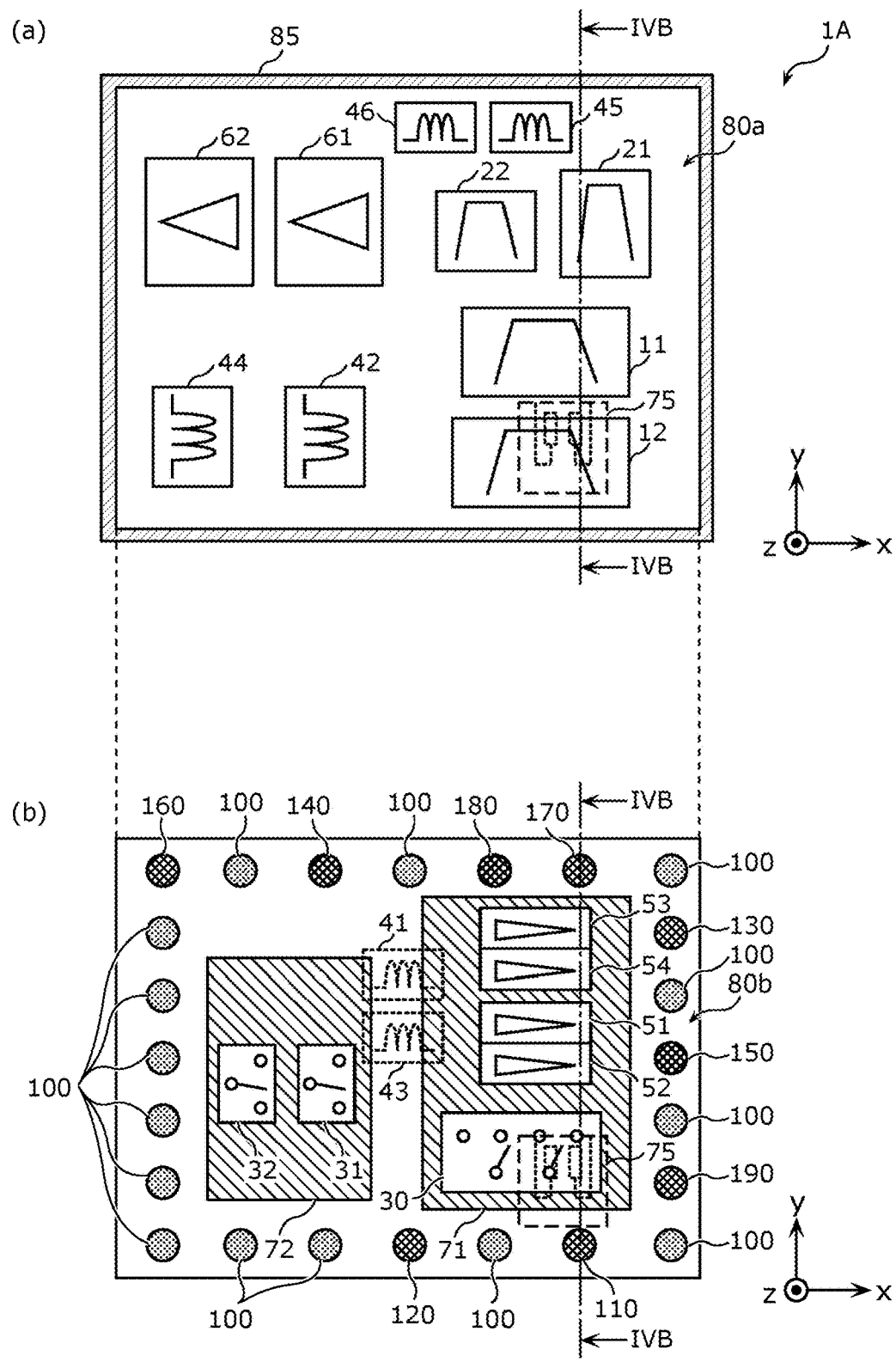
FIG. 4A is a schematic plan configuration diagram of a radio-frequency module according to Example 1.
Figure 4B:
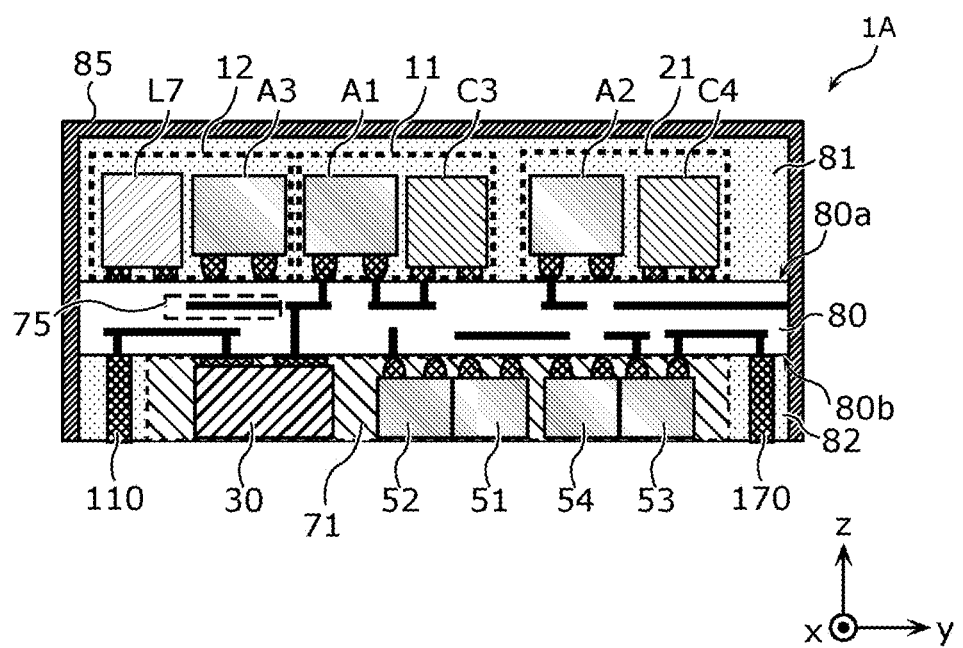
FIG. 4B is a schematic sectional configuration diagram of the radio-frequency module according to Example 1.

FIG. 4A is a schematic plan configuration diagram of a radio-frequency module 1A according to Example 1. Further, FIG. 4B is a schematic sectional configuration diagram of the radio-frequency module 1A according to Example 1, specifically, is a sectional view taken along a line IVB-IVB in FIG. 4A. Note that (a) of FIG. 4A illustrates a layout drawing of circuit components when, of main surfaces 80b and 80a of a module substrate 80 opposite to each other, the main surface 80a is viewed from a positive direction side of the z-axis. On the other hand, (b) of FIG. 4A is a diagram in which disposition of the circuit components is seen through the main surface 80b when viewed from the positive direction side of the z-axis. In addition, in FIG. 4A, in order to easily understand a disposition relationship among the respective circuit components, a mark indicating a function of each circuit component is added to each circuit component, but the mark is not added to the radio-frequency module 1A in reality.

The radio-frequency module 1A according to Example 1 specifically illustrates a disposition configuration of the circuit elements constituting the radio-frequency module 1 according to the exemplary embodiment.

As illustrated in 4A and 4B, the radio-frequency module 1A according to the present example further has the module substrate 80, resin members 81 and 82, an external connection terminal 100 and a metal shield layer 85, in addition to the circuit configuration illustrated in FIG. 1.

The module substrate 80 is an example of a substrate, has the main surface 80a and the main surface 80b opposite to each other, and is a substrate on which the circuit components constituting the radio-frequency module 1A are mounted. As the module substrate 80, for example, a low temperature co-fired ceramics (LTCC) substrate having a laminated structure of a plurality of dielectric layers, a high temperature co-fired ceramics (HTCC) substrate, a component built-in substrate, a substrate having a redistribution layer (RDL), a printed substrate, or the like is used.

Note that in the present example, the main surface 80a corresponds to a first main surface, and the main surface 80b corresponds to a second main surface.

Note that the module substrate 80 is an example of the substrate, and it is desirable that a multilayer structure in which a plurality of dielectric layers is laminated is included, and a ground electrode pattern is formed on at least one dielectric layer of the plurality of dielectric layers. Thus, an electromagnetic field shielding function of the module substrate 80 is improved.

Note that as illustrated in (b) of FIG. 4A, the antenna connection terminals 110 and 120, the transmission input terminals 140 and 160, the reception output terminals 130, 150, 170 and 180, and the coupler terminal 190 may be formed on the main surface 80b.

The resin member 81 is disposed on the main surface 80a and covers some of the circuit components constituting the radio-frequency module 1A and the main surface 80a. The resin member 82 is disposed on the main surface 80b and covers some of the circuit components constituting the radio-frequency module 1A and the main surface 80b. The resin members 81 and 82 have a function to ensure reliability such as mechanical strength and moisture resistance of the circuit components constituting the radio-frequency module 1A.

The metal shield layer 85 covers a surface of the resin member 81 and is set to a ground potential. The metal shield layer 85 is, for example, a metal thin film formed by sputtering.

Note that the resin members 81 and 82 and the metal shield layer 85 are not constituent elements essential for the radio-frequency module 1 according to the exemplary embodiment.

In the present example, each of the matching circuits 41 to 46 includes an inductor.

Note that although not illustrated in FIG. 4A, the wiring lines connecting the circuit components illustrated in FIG. 1 are formed inside the module substrate 80 and on the main surfaces 80a and 80b. Further, the above wiring line may be a bonding wire in which both ends are bonded to any one of the main surfaces 80a and 80b and the circuit components constituting the radio-frequency module 1A, or may be a terminal, an electrode or a wiring line formed on a surface of the circuit component constituting the radio-frequency module 1A.

As illustrated in FIG. 4A, in the radio-frequency module 1A according to the present example, the hybrid filters 11 and 21, the filters 12 and 22, the power amplifiers 61 and 62, and the matching circuits 42, 44, 45 and 46 are disposed on the main surface 80a. On the other hand, the switches 30, 31 and 32 and the low-noise amplifiers 51, 52, 53 and 54 are disposed on the main surface 80b. Further, the coupler 75 and the matching circuits 41 and 43 are disposed inside the module substrate 80. Further, the switch 30 is built in a semiconductor IC 71. Note that although not illustrated in the FIG. 4A, the switch 33 may be disposed on any of the main surfaces 80a and 80b. For example, the switch 33 may be built in the semiconductor IC 71 together with the switch 30, or may be built in a semiconductor IC 72 together with the switches 31 and 32.

According to the above-described configuration, the circuit components constituting the radio-frequency module 1A are distributed to and disposed on both the surfaces of the module substrate 80 with the module substrate 80 interposed therebetween. Thus, the radio-frequency module 1A can be reduced in size.

Note that it is preferable that the acoustic wave resonator A1 (the acoustic wave resonators P1 and P2) constituting the hybrid filter 11 is disposed on the main surface 80a, and the other circuit elements constituting the hybrid filter 11, the hybrid filter 21, the filters 12 and 22, the power amplifiers 61 and 62, and the matching circuits 42, 44, 45, and 46 and the circuit components may be disposed on the main surface 80b or inside the module substrate 80.

In addition, it is preferable that the switch 30 is disposed on the main surface 80b, and the switches 31 and 32 and the low-noise amplifiers 51, 52, 53 and 54 may be disposed on the main surface 80a or inside the module substrate 80.

Further, it is preferable that coupler 75 is disposed inside the module substrate 80, and matching circuits 41 and 43 may be disposed on the main surface 80a or 80b.

Here, as illustrated in FIG. 4A and FIG. 4B, in plan view of the module substrate 80, the semiconductor IC 71 and the acoustic wave resonator A1 at least partially overlap each other, and the semiconductor IC 71 and the coupler 75 at least partially overlap each other.

According to the above configuration, the switch 30 and the hybrid filter 11 can be connected to each other mainly by a via wiring line formed in the module substrate 80 along a vertical direction of the module substrate 80. Thus, a wiring line linking the switch 30 and the hybrid filter 11 can be shortened. Additionally, the switch 30 and the coupler 75 can be connected to each other mainly by the via wiring line formed in the module substrate 80 along the vertical direction of the module substrate 80. Thus, a wiring line linking the switch 30 and the coupler 75 can be shortened. Accordingly, a wiring line between the coupler 75 and the hybrid filter 11 can be shortened, thus it is possible to provide the radio-frequency module 1A in which a transmission loss of a radio-frequency signal in each of the first communication band and the second communication band is reduced.

Furthermore, a high-power transmission signal is transmitted through the wiring line between the coupler 75 and the hybrid filter 11, thus power consumption of the radio-frequency module 1A can be reduced by the reduction in the transmission loss.

In addition, in the radio-frequency module 1A according to the present example, the plurality of external connection terminals 100 is disposed on the main surface 80b. The radio-frequency module 1A exchanges electric signals with an external substrate disposed on a negative direction side of the z-axis of the radio-frequency module 1A via the plurality of external connection terminals 100. Some external connection terminals of the plurality of external connection terminals 100 may be the antenna connection terminals 110 and 120, the transmission input terminals 140 and 160, the reception output terminals 130, 150, 170, and 180, and the coupler terminal 190 as illustrated in (b) of FIG. 4A. Further, some other external connection terminals of the plurality of external connection terminals 100 are set to a ground potential of the external substrate.

Note that the external connection terminal 100 may be a columnar electrode penetrating the resin member 82 in a z-axis direction as illustrated in FIG. 4A and FIG. 4B, or the external connection terminal 100 may be a bump electrode formed on the main surface 80b. In this case, the resin member 82 need not be present on the main surface 80b.

On the main surface 80b facing the external substrate, of the main surfaces 80a and 80b, circuit components that are difficult to be reduced in height are not disposed, and the low-noise amplifiers 51 to 54 and the switches 30 to 32 that are easy to be reduced in height are disposed.

Further, the low-noise amplifiers 51 to 54 and the switch 30 are included in the semiconductor IC 71. According to the above, the low-noise amplifiers 51 to 54 and the switch 30 can be reduced in size and height.

Further, the switches 31 and 32 are included in the semiconductor IC 72. According to the above, the switches 31 and 32 can be reduced in size and height.

Since the semiconductor ICs 71 and 72 are disposed on the main surface 80b, the radio-frequency module 1A can be reduced in height.

In addition, the power amplifiers 61 and 62 are disposed on the main surface 80a, and the low-noise amplifiers 51 to 54 are disposed on the main surface 80b. According to the above, since the power amplifiers 61 and 62 and the low-noise amplifiers 51 to 54 are distributed with the module substrate 80 interposed therebetween, it is possible to improve isolation between transmission and reception.

Further, the acoustic wave resonators P5 and P6, the capacitor C4, and the inductors L4, L5, and L6 that constitute the hybrid filter 21 are disposed on the main surface 80a. On the other hand, the low-noise amplifier 53 connected to the hybrid filter 21 via the matching circuit 45 is disposed on the main surface 80b.

Here, as illustrated in FIG. 4A and FIG. 4B, in plan view of the module substrate 80, the hybrid filter 21 and the low-noise amplifier 53 at least partially overlap each other.

According to the above, the hybrid filter 21 and the low-noise amplifier 53 can be connected to each other mainly by a via wiring line formed in the module substrate 80 along the vertical direction of the module substrate 80. Thus, a wiring line linking the hybrid filter 21 and the low-noise amplifier 53 can be shortened, and a transmission loss of a reception signal in the first communication band can be reduced.

Note that it is sufficient that at least one of the acoustic wave resonators P5 and P6, the capacitor C4, and the inductors L4, L5, and L6 is disposed on the main surface 80a, and at least one of the others may be disposed inside the module substrate 80 or on the main surface 80b. According to the above, since some of the circuit elements of the hybrid filter 21 and the low-noise amplifier 53 are distributed to and disposed on both the surfaces of the module substrate 80 with the module substrate 80 interposed therebetween, the radio-frequency module 1A can be reduced in size.

[4. Disposition Configuration of Circuit Elements of Radio-Frequency Module 1B According to Example 2]

Figure 5A:
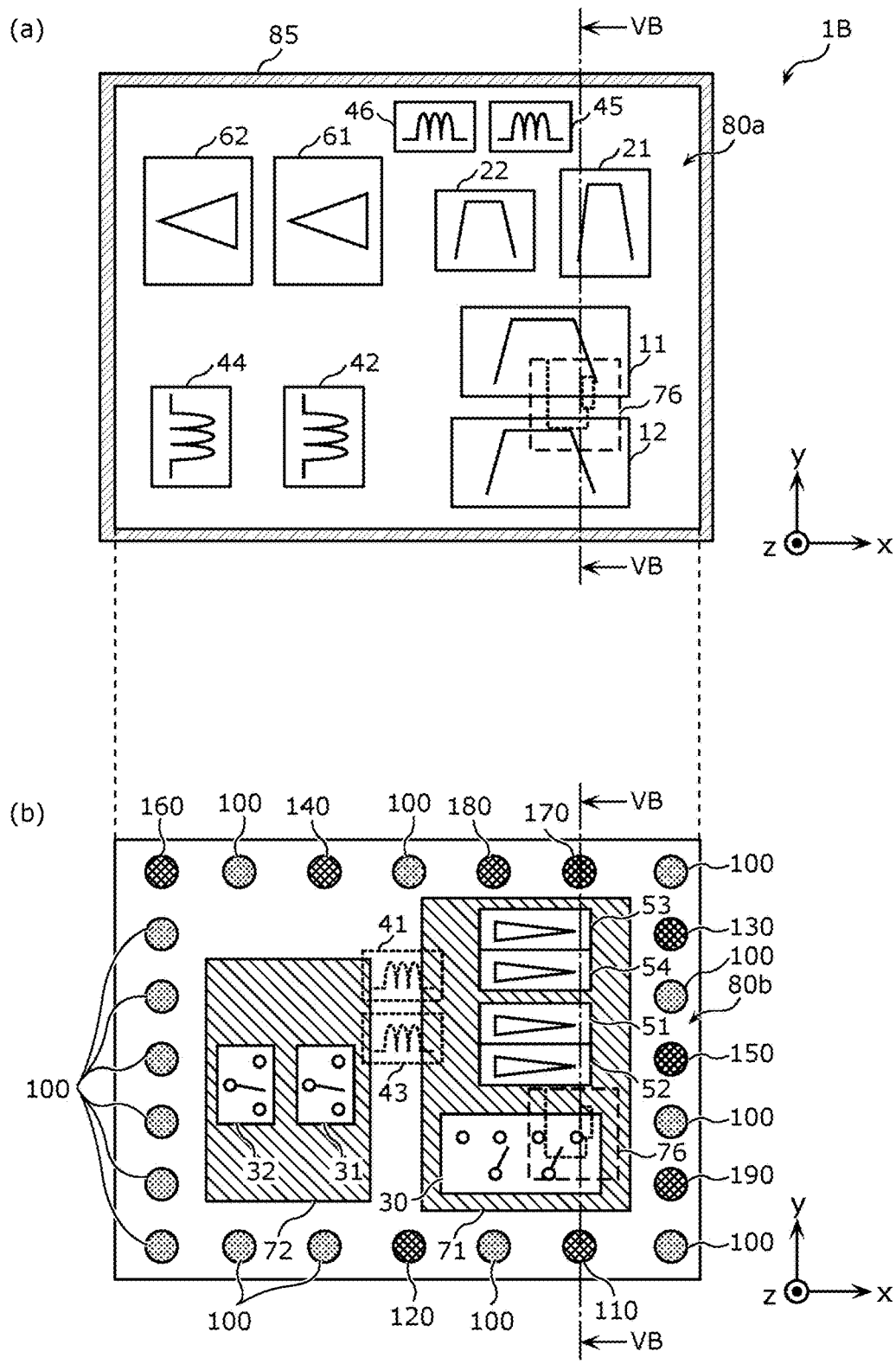
FIG. 5A is a schematic plan configuration diagram of a radio-frequency module according to Example 2.
Figure 5B:
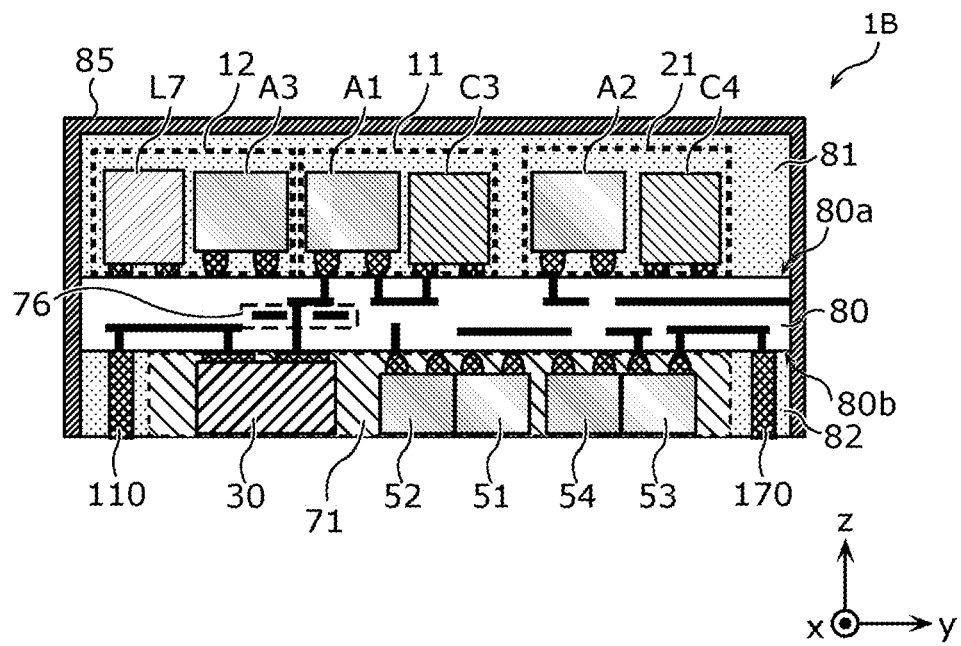
FIG. 5B is a schematic sectional configuration diagram of the radio-frequency module according to Example 2.

FIG. 5A is a schematic plan configuration diagram of a radio-frequency module 1B according to Example 2. Further, FIG. 5B is a schematic sectional configuration diagram of the radio-frequency module 1B according to Example 2, specifically, is a sectional view taken along a line VB-VB in FIG. 5A. Note that (a) of FIG. 5A illustrates a layout drawing of circuit components when the main surface 80a of the main surfaces 80b and 80a of the module substrate 80 facing each other is viewed from the positive direction side of the z-axis. On the other hand, (b) of FIG. 5A is a diagram in which disposition of the circuit components is seen through the main surface 80b when viewed from the positive direction side of the z-axis. In addition, in FIG. 5A, in order to easily understand a disposition relationship among the respective circuit components, a mark indicating a function of each circuit component is added to each circuit component, but the mark is not added to the radio-frequency module 1B in reality.

The radio-frequency module 1B according to Example 2 specifically illustrates a disposition configuration of the circuit elements constituting the radio-frequency module 6 according to the modification of the exemplary embodiment.

As illustrated in 5A and 5B, the radio-frequency module 1B according to the present example further has the module substrate 80, the resin members 81 and 82, the external connection terminal 100 and the metal shield layer 85, in addition to the circuit configuration illustrated in FIG. 3.

The radio-frequency module 1B according to the present example is different from the radio-frequency module 1A according to Example 1 in a disposition configuration of the coupler 76. Hereinafter, with respect to the radio-frequency module 1B according to the present example, a description of the same configuration as that of the radio-frequency module 1A according to Example 1 will be omitted, and a description will be given focusing on a different configuration.

Note that although not illustrated in FIG. 5A, the wiring lines connecting the circuit components illustrated in FIG. 3 are formed inside the module substrate 80 and on the main surfaces 80a and 80b. Further, the above wiring line may be a bonding wire in which both ends are bonded to any one of the main surfaces 80a and 80b and the circuit components constituting the radio-frequency module 1B, or may be a terminal, an electrode, or a wiring line formed on a surface of the circuit component constituting the radio-frequency module 1B.

As illustrated in FIG. 5A, in the radio-frequency module 1B according to the present example, the hybrid filters 11 and 21, the filters 12 and 22, the power amplifiers 61 and 62, and the matching circuits 42, 44, 45 and 46 are disposed on the main surface 80a. On the other hand, the switches 30, 31 and 32 and the low-noise amplifiers 51, 52, 53 and 54 are disposed on the main surface 80b. Further, the coupler 76 and the matching circuits 41 and 43 are disposed inside the module substrate 80. Further, the switch 30 is built in the semiconductor IC 71.

According to the above-described configuration, the circuit components constituting the radio-frequency module 1B are distributed to and disposed on both the surfaces of the module substrate 80 with the module substrate 80 interposed therebetween. According to the above, the radio-frequency module 1B can be reduced in size.

Note that it is preferable that the acoustic wave resonator A1 (the acoustic wave resonators P1 and P2) constituting the hybrid filter 11 is disposed on the main surface 80a, and the other circuit elements constituting the hybrid filter 11, the hybrid filter 21, the filters 12 and 22, the power amplifiers 61 and 62, and the matching circuits 42, 44, 45, and 46 and the circuit components may be disposed on the main surface 80b or inside the module substrate 80.

In addition, it is preferable that the switch 30 is disposed on the main surface 80b, and the switches 31 and 32 and the low-noise amplifiers 51, 52, 53 and 54 may be disposed on the main surface 80a or inside the module substrate 80.

Further, it is preferable that coupler 76 is disposed inside the module substrate 80, and matching circuits 41 and 43 may be disposed on the main surface 80a or 80b.

Here, as illustrated in FIG. 5A and FIG. 5B, in plan view of the module substrate 80, the coupler 76 and the acoustic wave resonator A1 at least partially overlap each other, and the coupler 76 and the semiconductor IC 71 at least partially overlap each other.

According to the above configuration, the coupler 76 and the hybrid filter 11 can be connected to each other mainly by a via wiring line formed in the module substrate 80 along the vertical direction of the module substrate 80. Thus, a wiring line linking the coupler 76 and the hybrid filter 11 can be shortened. Additionally, the coupler 76 and the switch 30 can be connected to each other mainly by the via wiring line formed in the module substrate 80 along the vertical direction of the module substrate 80. Thus, a wiring line linking the hybrid filter 11 and the switch 30 can be shortened. According to the above, the wiring line between the switch 30 and the hybrid filter 11 can be shortened, thus it is possible to provide the radio-frequency module 1B in which a transmission loss of a radio-frequency signal in the first communication band is reduced.

Furthermore, since a high-power transmission signal is transmitted through the wiring line between the switch 30 and the hybrid filter 11, power consumption of the radio-frequency module 1B can be reduced by the reduction in the transmission loss.

[5. Disposition Configuration of Circuit Elements of Radio-Frequency Module 1C According to Example 3]

Figure 5C:
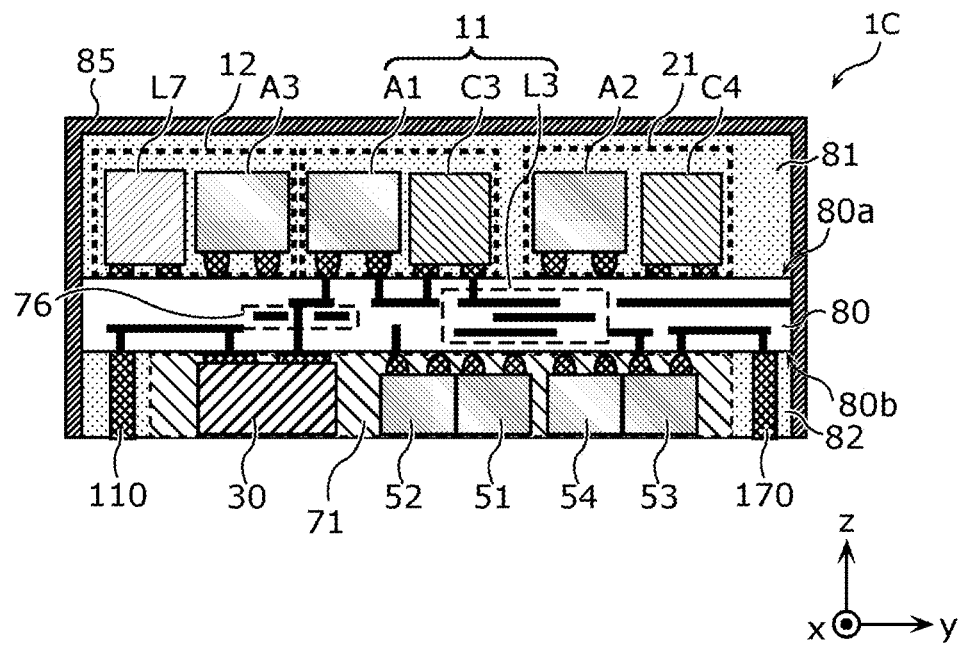
FIG. 5C is a schematic sectional configuration diagram of a radio-frequency module according to Example 3.

FIG. 5C is a schematic sectional configuration diagram of a radio-frequency module 1C according to Example 3. The radio-frequency module 1C according to the present example specifically illustrates a disposition configuration of the circuit elements constituting the radio-frequency module 6 according to the modification of the exemplary embodiment.

The radio-frequency module 1C illustrated in FIG. 5C is different from the radio-frequency module 1B according to Example 2 in a disposition configuration of the circuit elements constituting the hybrid filter 11. Hereinafter, with respect to the radio-frequency module 1C according to the present example, a description of the same configuration as that of the radio-frequency module 1B according to Example 2 will be omitted, and a description will be given focusing on a different configuration.

The hybrid filter 11 includes the acoustic wave resonator A1 (acoustic wave resonators P1 and P2), the capacitor C3, and the inductors L1, L2, and L3.

Here, in the hybrid filter 11, the acoustic wave resonator A1 and the capacitor C3 are disposed on the main surface 80a, and the inductor L3 is formed inside the module substrate 80. The inductor L3 is constituted with, for example, a plurality of planar coil conductors and a via conductor that connects the planar coil conductors.

According to the above configuration, some of the circuit elements constituting the hybrid filter 11 are disposed on the main surface 80a, and the other circuit elements constituting the hybrid filter 11 are formed inside the module substrate 80, thus the radio-frequency module 1C can be reduced in size.

Note that the circuit element formed inside the module substrate 80 may be the capacitor C3.

[6. Effects and the Like]

As described above, the radio-frequency module 1A according to Example 1 includes the module substrate 80 having the main surfaces 80a and 80b opposite to each other, the antenna connection terminal 110, the hybrid filter 11 having the first acoustic wave resonator, the first inductor, and the first capacitor, the switch 30 connected between the antenna connection terminal 110 and the hybrid filter 11 and configured to switch between connection and disconnection between the antenna connection terminal 110 and the hybrid filter 11, and the coupler 75 disposed on the path linking the antenna connection terminal 110 and the switch 30. The first acoustic wave resonator is disposed on the main surface 80a, the switch 30 is included in the semiconductor IC 71 disposed on the main surface 80b, the coupler 75 is disposed inside the module substrate 80, and in plan view of the module substrate 80, the semiconductor IC 71 and the first acoustic wave resonator at least partially overlap each other, and the semiconductor IC 71 and the coupler 75 at least partially overlap each other.

According to the above, the switch 30 and the hybrid filter 11 can be connected to each other mainly by the via wiring line formed in the module substrate 80 along the vertical direction of the module substrate 80. Thus, the wiring line linking the switch 30 and the hybrid filter 11 can be shortened. Additionally, the switch 30 and the coupler 75 can be connected to each other mainly by the via wiring line formed in the module substrate 80 along the vertical direction of the module substrate 80. Thus, the wiring line linking the switch 30 and the coupler 75 can be shortened. Accordingly, the wiring line between the coupler and the hybrid filter 11 can be shortened, thus it is possible to provide the radio-frequency module 1A in which a transmission loss of a radio-frequency signal in each of the first communication band and the second communication band is reduced. Furthermore, a high-power transmission signal is transmitted through the wiring line between the coupler and the hybrid filter 11, thus power consumption of the radio-frequency module 1A can be reduced by the reduction in the transmission loss.

Additionally, the radio-frequency module 1B according to Example 2 includes the module substrate 80 having the main surfaces 80a and 80b opposite to each other, the antenna connection terminal 110, the hybrid filter 11 having the first acoustic wave resonator, the first inductor, and the first capacitor, the switch 30 connected between the antenna connection terminal 110 and the hybrid filter 11 and configured to switch between connection and disconnection between the antenna connection terminal 110 and the hybrid filter 11, and the coupler 76 disposed on the path linking the switch 30 and the hybrid filter 11. The first acoustic wave resonator is disposed on the main surface 80a, the switch 30 is included in the semiconductor IC 71 disposed on the main surface 80b, the coupler 76 is disposed inside the module substrate 80, and in plan view of the module substrate 80, the coupler 76 and the first acoustic wave resonator at least partially overlap each other, and the coupler 76 and the semiconductor IC 71 at least partially overlap each other.

According to the above, the coupler 76 and the hybrid filter 11 can be connected to each other mainly by the via wiring line formed in the module substrate 80 along the vertical direction of the module substrate 80. Thus, the wiring line linking the coupler 76 and the hybrid filter 11 can be shortened. Additionally, the coupler 76 and the switch 30 can be connected to each other mainly by the via wiring line formed in the module substrate 80 along the vertical direction of the module substrate 80. Thus, the wiring line linking the hybrid filter 11 and the switch 30 can be shortened. According to the above, the wiring line between the switch 30 and the hybrid filter 11 can be shortened, thus it is possible to provide the radio-frequency module 1B in which a transmission loss of a radio-frequency signal in the first communication band is reduced. Furthermore, since a high-power transmission signal is transmitted through the wiring line between the switch 30 and the hybrid filter 11, power consumption of the radio-frequency module 1B can be reduced by the reduction in the transmission loss.

In addition, in the radio-frequency module 1C according to Example 3, at least one of the first inductor and the first capacitor may be disposed inside the module substrate 80.

According to the above, some of the circuit elements constituting the hybrid filter 11 are disposed on the main surface 80a, and the other circuit elements constituting the hybrid filter 11 are formed inside the module substrate 80, thus the radio-frequency module 1C can be reduced in size.

Further, each of the radio-frequency modules 1A to 1C may further include the power amplifier 61, the low-noise amplifier 51, and the switch 31 that is connected to the hybrid filter 11, the power amplifier 61, and the low-noise amplifier 51 and switches between connection between the hybrid filter 11 and the power amplifier 61 and connection between the hybrid filter 11 and the low-noise amplifier 51.

According to the above, the hybrid filter 11 can function as a TDD filter for both transmission and reception.

Further, each of the radio-frequency modules 1A to 1C may further include the external connection terminal 100 disposed on the main surface 80b, the power amplifier 61 may be disposed on the main surface 80a, and the low-noise amplifier 52 may be included in the semiconductor IC 71.

According to the above, since the power amplifier 61 and the low-noise amplifier 51 are distributed with the module substrate 80 interposed therebetween, it is possible to improve isolation between transmission and reception.

Further, each of the radio-frequency modules 1A to 1C may further include the hybrid filter 21 having the second acoustic wave resonator, the second inductor, and the second capacitor, and the low-noise amplifier 53 disposed on the main surface 80b, one of the second acoustic wave resonator, the second inductor, and the second capacitor may be disposed on the main surface 80a, the hybrid filter 21 may be a reception-only filter connected between the switch 30 and the low-noise amplifier 53, and in plan view of the module substrate 80, the hybrid filter 21 and the low-noise amplifier 53 may at least partially overlap each other.

According to the above, the hybrid filter 21 and the low-noise amplifier 53 can be connected to each other mainly by the via wiring line formed in the module substrate 80 along the vertical direction of the module substrate 80. Thus, the wiring line linking the hybrid filter 21 and the low-noise amplifier 53 can be shortened, and a transmission loss of a reception signal in the first communication band can be reduced.

In addition, in each of the radio-frequency modules 1A to 1C, the low-noise amplifier 53 may be included in the semiconductor IC 71.

According to the above, the low-noise amplifier 53 and the switch 30 can be reduced in size and height.

In addition, in each of the radio-frequency modules 1A to 1C, the pass band of the hybrid filter 11 may include at least one of Band 42, Band 43, Band 48, and Band 49 of 4G-LTE, n77, n78, n79, n46, n96, and n97 of 5G-NR, WLAN (5150 to 5350 MHz), WLAN (5470 to 5850 MHz), and WLAN (5925 to 7125 MHz).

Further, the communication device 5 includes the RFIC 3 that processes radio-frequency signals received by the antennas 2A and 2B, and the radio-frequency module 1 that propagates the radio-frequency signals between the antennas 2A and 2B and the RFIC 3.

According to the above, it is possible to provide the communication device 5 with a reduced transmission loss despite having the hybrid filter 11 and the coupler 75.

Other Exemplary Embodiments

Although the radio-frequency module and the communication device according to the present disclosure have been described by illustrating the exemplary embodiment and the examples, the present disclosure is not limited to the exemplary embodiment and the examples described above. Other embodiments achieved by combining arbitrary constituent elements in the above-described exemplary embodiment and examples, modifications obtained by applying various modifications conceived by a person skilled in the art to the above-described exemplary embodiment without departing from the gist of the present disclosure, and various devices incorporating the radio-frequency module and the communication device according to the present disclosure are also included in the present disclosure.

Further, for example, in the radio-frequency module and the communication device according to the exemplary embodiment and the examples, matching elements, such as an inductor and a capacitor, and a switch circuit may be connected between the constituent elements. Note that the inductor may include a wiring inductor formed by a wiring line that connects the constituent elements.

INDUSTRIAL APPLICABILITY

The present disclosure can be widely used in communication devices such as mobile phones, as a radio-frequency module and a communication device applicable to a multiband system.

REFERENCE SIGNS LIST 1, 1A, 1B, 1C, 6 RADIO-FREQUENCY MODULE
2A, 2B ANTENNA
3 RF SIGNAL PROCESSING CIRCUIT (RFIC)
4 BASEBAND SIGNAL PROCESSING CIRCUIT (BBIC)
5 COMMUNICATION DEVICE
10, 20 RADIO-FREQUENCY CIRCUIT
11, 21 HYBRID FILTER
12, 22 FILTER
31, 32, 33 SWITCH
30a, 30b COMMON TERMINAL
30a, 30d, 30e, 30f SELECTION TERMINAL
41, 42, 43, 44, 45, 46 MATCHING CIRCUIT
51, 52, 53, 54 LOW-NOISE AMPLIFIER
61, 62 POWER AMPLIFIER
71, 72 SEMICONDUCTOR IC
76 COUPLER
80 MODULE SUBSTRATE
80b MAIN SURFACE
81, 82 RESIN MEMBER
85 METAL SHIELD LAYER
100 EXTERNAL CONNECTION TERMINAL
101, 102, 103, 104 INPUT/OUTPUT TERMINAL
110, 120 ANTENNA CONNECTION TERMINAL
130, 150, 170, 180 RECEPTION OUTPUT TERMINAL
140, 160 TRANSMISSION INPUT TERMINAL
190 COUPLER TERMINAL
A1, A2, A3 ACOUSTIC WAVE RESONATOR
C3, C4 CAPACITOR
L1, L2, L3, L4, L5, L6, L7, L8 INDUCTOR
P1, P2, P5, P6 ACOUSTIC WAVE RESONATOR

The invention claimed is:

1. A radio-frequency module, comprising:
a substrate having a first main surface that is opposite to a second main surface;
an antenna connection terminal;
a first hybrid filter having a first acoustic wave resonator, a first inductor, and a first capacitor;
a first switch connected between the antenna connection terminal and the first hybrid filter and configured to connect and disconnect the antenna connection terminal and the first hybrid filter; and
a coupler disposed on a path linking the antenna connection terminal and the first switch,
wherein the first acoustic wave resonator is disposed on the first main surface,
the first switch is included in a semiconductor integrated circuit (IC) disposed on the second main surface,
the coupler is disposed inside the substrate, and
in a plan view of the substrate, the semiconductor IC at least partially overlaps the first acoustic wave resonator, and the semiconductor IC at least partially overlaps the coupler.

2. The radio-frequency module according to claim 1, wherein at least one of the first inductor and the first capacitor is disposed inside the substrate.

3. The radio-frequency module according to claim 1, further comprising:
a first power amplifier;
a first low-noise amplifier; and
a second switch connected to the first hybrid filter, the first power amplifier, and the first low-noise amplifier and configured to connect the first hybrid filter and the first power amplifier or connect the first hybrid filter and the first low-noise amplifier.

4. The radio-frequency module according to claim 3, further comprising an external connection terminal disposed on the second main surface,
wherein the first power amplifier is disposed on the first main surface, and
the first low-noise amplifier is included in the semiconductor IC.

5. The radio-frequency module according to claim 3, further comprising a matching circuit between the first low-noise amplifier and the second switch.

6. The radio-frequency module according to claim 5, wherein the matching circuit is disposed on the second main surface.

7. The radio-frequency module according to claim 1, further comprising:
a second hybrid filter having a second acoustic wave resonator, a second inductor, and a second capacitor; and
a second low-noise amplifier disposed on the second main surface,
wherein one of the second acoustic wave resonator, the second inductor, and the second capacitor is disposed on the first main surface,
the second hybrid filter is a reception-only filter connected between the first switch and the second low-noise amplifier, and
in the plan view of the substrate, the second hybrid filter at least partially overlaps the second low-noise amplifier.

8. The radio-frequency module according to claim 7, wherein the second low-noise amplifier is included in the semiconductor IC.

9. The radio-frequency module according to claim 1, wherein a pass band of the first hybrid filter includes at least one of Band 42, Band 43, Band 48, and Band 49 of 4G-LTE, n77, n78, n79, n46, n96, and n97 of 5G-NR, WLAN (5150 to 5350 MHz), WLAN (5470 to 5850 MHz), and WLAN (5925 to 7125 MHz).

10. A communication device, comprising:
a radio frequency (RF) signal processing circuit configured to process a radio-frequency signal received by an antenna; and
the radio-frequency module according to claim 1 configured to propagate the radio-frequency signal between the antenna and the RF signal processing circuit.

11. The radio frequency module according to claim 1, wherein the first acoustic wave resonator is one of a surface acoustic wave (SAW) and a bulk acoustic wave (BAW) resonator.

12. The radio frequency module according to claim 1, wherein the first acoustic wave resonator is one of a surface acoustic wave (SAW) and a bulk acoustic wave (BAW) resonator.

13. A radio-frequency module, comprising:
- a substrate having a first main surface that is opposite to a second main surface;
- an antenna connection terminal;
- a first hybrid filter having a first acoustic wave resonator, a first inductor, and a first capacitor;
- a first switch connected between the antenna connection terminal and the first hybrid filter and configured to connect and disconnect the antenna connection terminal and the first hybrid filter; and
- a coupler disposed on a path linking the first switch and the first hybrid filter,
- wherein the first acoustic wave resonator is disposed on the first main surface,
- the first switch is included in a semiconductor integrated circuit (IC) disposed on the second main surface,
- the coupler is disposed inside the substrate, and
- in a plan view of the substrate, the coupler at least partially overlaps the first acoustic wave resonator, and the coupler at least partially overlaps the semiconductor IC.

14. The radio-frequency module according to claim 13, wherein at least one of the first inductor and the first capacitor is disposed inside the substrate.

15. The radio-frequency module according to claim 13, further comprising:
- a first power amplifier;
- a first low-noise amplifier; and
- a second switch connected to the first hybrid filter, the first power amplifier, and the first low-noise amplifier and configured to connect the first hybrid filter and the first power amplifier or connect the first hybrid filter and the first low-noise amplifier.

16. The radio frequency module according to claim 15, further comprising a matching circuit between the first low-noise amplifier and the second switch.

17. The radio frequency module according to claim 16, wherein the matching circuit is disposed on the second main surface.

18. The radio-frequency module according to claim 13, further comprising:
- a second hybrid filter having a second acoustic wave resonator, a second inductor, and a second capacitor; and
- a second low-noise amplifier disposed on the second main surface,
- wherein one of the second acoustic wave resonator, the second inductor, and the second capacitor is disposed on the first main surface,
- the second hybrid filter is a reception-only filter connected between the first switch and the second low-noise amplifier, and
- in the plan view of the substrate, the second hybrid filter at least partially overlaps the second low-noise amplifier.

19. The radio-frequency module according to claim 13, wherein a pass band of the first hybrid filter includes at least one of Band 42, Band 43, Band 48, and Band 49 of 4G-LTE, n77, n78, n79, n46, n96, and n97 of 5G-NR, WLAN (5150 to 5350 MHz), WLAN (5470 to 5850 MHz), and WLAN (5925 to 7125 MHz).

20. A communication device, comprising:
- a radio frequency (RF) signal processing circuit configured to process a radio-frequency signal received by an antenna; and
- the radio-frequency module according to claim 13 configured to propagate the radio-frequency signal between the antenna and the RF signal processing circuit.

* * * * *